(12) United States Patent
Zhang et al.

(10) Patent No.: US 11,522,023 B2
(45) Date of Patent: Dec. 6, 2022

(54) DISPLAY DEVICE

(71) Applicant: Wuhan China Star Optoelectronics Technology Co., Ltd., Wuhan (CN)

(72) Inventors: Guiyang Zhang, Wuhan (CN); Guowei Zha, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/488,594

(22) PCT Filed: May 8, 2019

(86) PCT No.: PCT/CN2019/085993
§ 371 (c)(1),
(2) Date: Aug. 25, 2019

(87) PCT Pub. No.: WO2020/191862
PCT Pub. Date: Oct. 1, 2020

(65) Prior Publication Data
US 2022/0013600 A1   Jan. 13, 2022

(30) Foreign Application Priority Data

Mar. 26, 2019 (CN) .......................... 201910234338.6

(51) Int. Cl.
*G09G 3/30* (2006.01)
*H01L 27/32* (2006.01)

(52) U.S. Cl.
CPC ...... *H01L 27/3232* (2013.01); *H01L 27/3244* (2013.01); *H01L 27/3281* (2013.01)

(58) Field of Classification Search
CPC ............. H01L 27/3232; H01L 27/3244; H01L 27/3281
(Continued)

(56) References Cited

U.S. PATENT DOCUMENTS 9,482,885 B2 * 11/2016 Joo ........................ G02F 1/0147
10,228,602 B2 * 3/2019 Cao ..................... H01L 51/5203
(Continued)

FOREIGN PATENT DOCUMENTS

| CN | 107920142 A | 4/2018 |
|---|---|---|
| CN | 108254963 A | 7/2018 |

(Continued)

*Primary Examiner* — Thuy N Pardo
(74) *Attorney, Agent, or Firm* — PV IP PC; Wei Te Chung; Ude Lu (57) ABSTRACT

The present invention provides a display device which includes a display panel, a light shielding member, and an electronic element. The display panel includes a first display region and a second display region disposed corresponding to the electronic element, and a light transmittance of the second display region is greater than a light transmittance of the first display region. When the electronic element is in operation, the light shielding member is opened to open a light-transmitting channel between the electronic element and the second display region. When the electronic element is not in operation, the light shielding member is closed to close the light-transmitting channel. When the electronic element needs to be used, the light shielding member is opened. When the electronic element is not needed, the light shielding member shield the electronic element to hide it.

16 Claims, 3 Drawing Sheets

(58) Field of Classification Search
USPC .................. 345/76, 8, 629, 77, 84; 349/89
See application file for complete search history.

(56) References Cited

U.S. PATENT DOCUMENTS

| | | | | |
|---|---|---|---|---|
| 2009/0073351 | A1* | 3/2009 | Kakinuma | G02F 1/1334 349/89 |
| 2016/0041396 | A1* | 2/2016 | Kawamura | G02B 27/0172 345/8 |
| 2016/0161770 | A1* | 6/2016 | Joo | G02F 1/1335 359/241 |
| 2016/0212311 | A1 | 7/2016 | Mathew et al. | |
| 2016/0379394 | A1* | 12/2016 | Kim | G02B 30/27 345/629 |
| 2017/0202455 | A1* | 7/2017 | Farrer | A61B 3/005 |
| 2017/0345402 | A1* | 11/2017 | Zhou | H04N 13/388 |
| 2018/0004047 | A1* | 1/2018 | Yamazaki | H01L 27/3248 |
| 2018/0113564 | A1* | 4/2018 | Takahashi | G06F 3/0446 |
| 2018/0136519 | A1* | 5/2018 | Yata | G02B 6/0051 |
| 2018/0260079 | A1* | 9/2018 | Zhang | G06F 3/0481 |
| 2019/0196635 | A1* | 6/2019 | Park | G01S 17/04 |
| 2019/0267996 | A1* | 8/2019 | Kontani | G06F 3/0219 |
| 2019/0278141 | A1* | 9/2019 | Yamazaki | G02F 1/133345 |
| 2020/0104042 | A1* | 4/2020 | Tsai | G06F 1/1662 |
| 2020/0117034 | A1 | 4/2020 | Yin et al. | |
| 2020/0160775 | A1 | 5/2020 | Zhang et al. | |
| 2020/0264671 | A1* | 8/2020 | Yoshitani | G06F 3/0446 |
| 2020/0335572 | A1* | 10/2020 | Mo | H01L 27/3246 |
| 2021/0055847 | A1* | 2/2021 | Takahashi | G09G 3/3266 |

FOREIGN PATENT DOCUMENTS

| | | |
|---|---|---|
| CN | 108885376 A | 11/2018 |
| CN | 208384467 U | 1/2019 |
| GB | 201220238 | 12/2012 |

* cited by examiner

DISPLAY DEVICE

1. FIELD OF DISCLOSURE

The present invention relates to a field of display device techniques and in particular, to a display device.

2. DESCRIPTION OF RELATED ART

Conventional display devices needs to have a drilled hole for placing electronic elements. A larger screen size and a higher screen ratio are the trend for future screen development. With a notch screen, a water-drop notch screen, and an inner-hole screen appearing one after another, a screen ratio is increasingly raised from around 80% to 95%. The increase in the screen ratio can increase a display area, and also improve user perception, so full-screen technology is therefore more and more popular.

In active displays such as a quantum dots light emitting diode display (QLED), an organic light emitting diode (OLED) and a micro light emitting diode (μLED), a camera and other components can be disposed under a screen surface through a certain pixel design according to requirements to achieve a full screen display.

Conventional display devices have a technical problem that it is necessary to dig holes in a display device to place electronic elements therein.

SUMMARY

The present invention provides a display device for solving an existing problem that a conventional display device needs to be drilled a hole for placing an electronic element.

Accordingly, the present invention provides technical solutions as follows.

The present invention provides a display device, comprising:
a display panel;
a light shielding member; and
an electronic element;
wherein the display panel comprises a first display region and a second display region disposed corresponding to the electronic element, and a light transmittance of the second display region is greater than a light transmittance of the first display region, wherein when the electronic element is in operation, the light shielding member is opened to open a light-transmitting channel between the electronic element and the second display region, and when the electronic element is not in operation, the light shielding member is closed to close the light-transmitting channel.

In the display device of the present invention, the light shielding member is disposed on the electronic element.

In the display device of the present invention, the electronic element is a camera, and the light shielding member is disposed on a shutter of the camera.

In the display device of the present invention, the light shielding member and the electronic element are made of two different materials.

In the display device of the present invention, the light shielding member is disposed on the display panel.

In the display device of the present invention, the light shielding member is made of electrochromic glass and disposed on the display panel.

In the display device of the present invention, the light shielding member is disposed in a light emitting direction of the display panel.

In the display device of the present invention, the light shielding member is disposed in a direction in which the display panel faces the electronic element.

In the display device of the present invention, the display panel comprises a color changing layer, and the color changing layer is transparent in an operation time.

In the display device of the present invention, a pixel aperture ratio of the second display region is less than a pixel aperture ratio of the first display region, and a light transmissive region is formed between pixels.

In the display device of the present invention, the light shielding member and the display panel are made of two different materials.

In the display device of the present invention, the light shielding member and the display panel are integrally formed in one piece.

In the display device of the present invention, the light shielding member is a separately formed member, and the light shielding member comprises a motor.

In the display device of the present invention, a pixel width in the second display region is shortened.

In the display device of the present invention, a pixel length in the second display region is shortened.

In the display device of the present invention, the electronic element is a sensor.

In the display device of the present invention, the electronic element is a light source array.

In the display device of the present invention, the electronic element is a speaker.

In the display device of the present invention, a plurality of leads in the second display region are made of a light transmissive material.

In the display device of the present invention, a plurality of pixels in the second display region are made of a light transmissive material.

The present invention has the following advantages. The present invention provides a display device which includes a display panel, a light shielding member, and an electronic element. The display panel comprises a first display region and a second display region disposed corresponding to the electronic element, and a light transmittance of the second display region is greater than a light transmittance of the first display region, wherein when the electronic element is in operation, the light shielding member is opened to open a light-transmitting channel between the electronic element and the second display region, and when the electronic element is not in operation, the light shielding member is closed to close the light-transmitting channel. When the electronic element needs to be used, the light shielding member is opened. When the electronic element is not needed, the light shielding member shield the electronic element to hide it. Therefore, a screen ratio is increased, a full screen design is realized, and the present invention eliminates a need to drill a hole in the display device and place the electronic element in the hole.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

The following description is provided to illustrate specific embodiments of the present invention. Directional terms mentioned in this application, such as "upper", "lower", "front", "rear", "left", "right", "inside", "outside", "lateral", are only illustrative with reference to the drawings. Therefore, the directional terms used are for the purpose of illustration and for ease of understanding, and are not intended to be limiting. In the drawings, structurally similar elements are denoted by the same reference numerals.

The present invention solves an existing problem of conventional display devices. The existing problem is that the conventional display device needs to be drilled a hole to place an electronic element.

Figure 1:
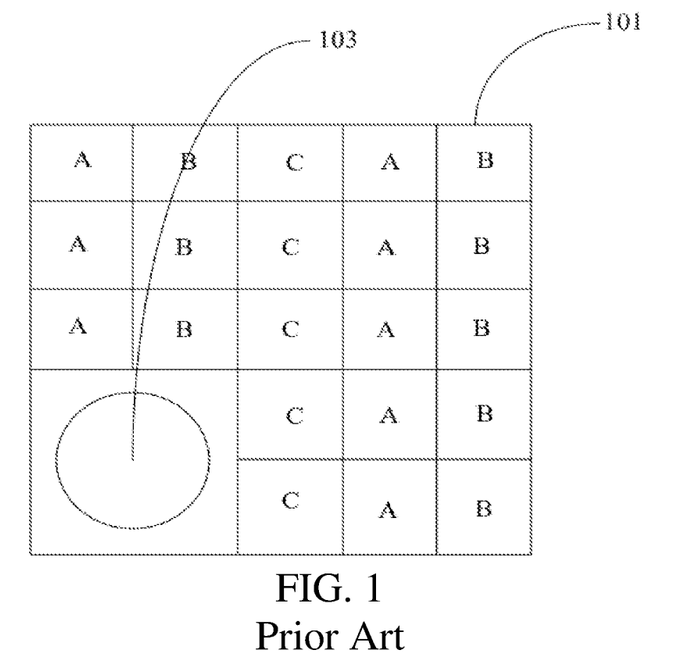
FIG. 1 is a top view illustrating a display device of a prior art.
Figure 2:
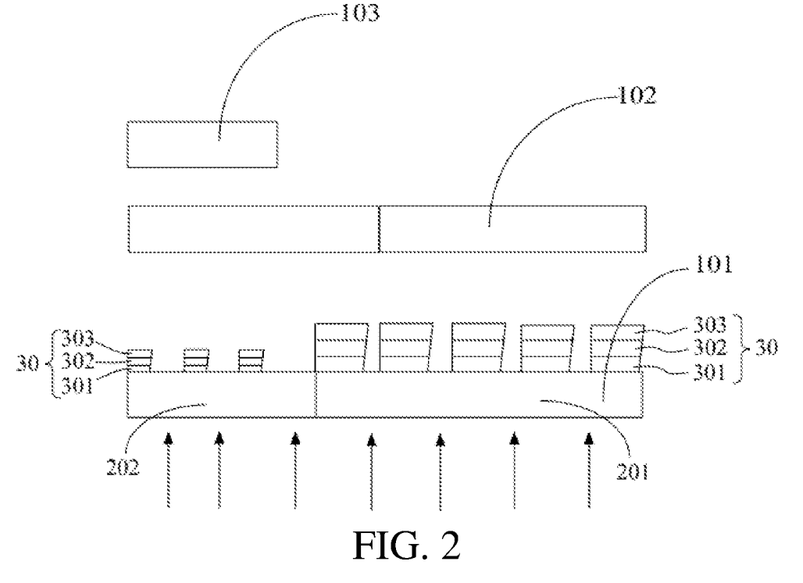
FIG. 2 is a first cross-sectional view illustrating the display device according to one embodiment of the present invention.
Figure 3:
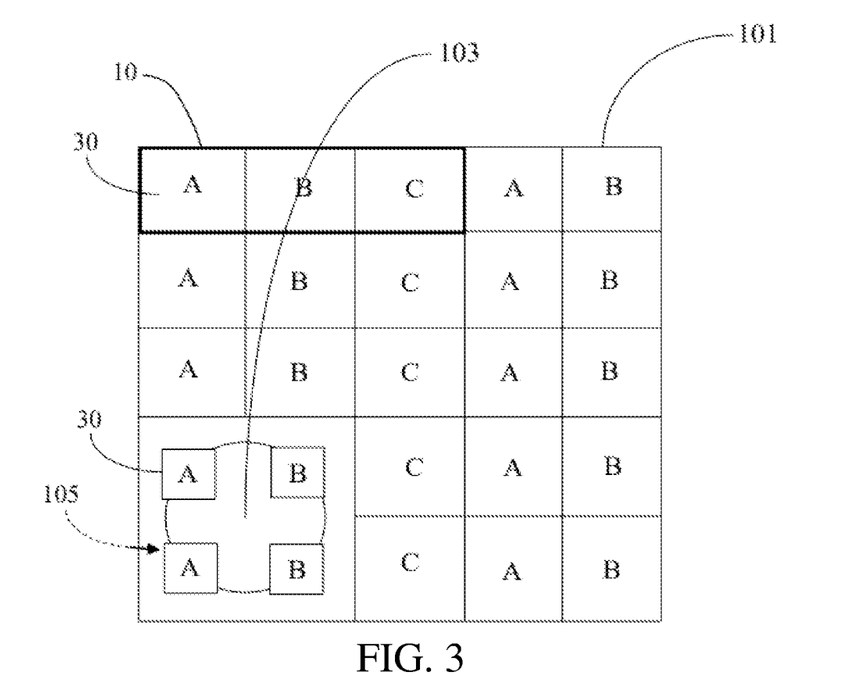
FIG. 3 is a first top view illustrating the display device according to one embodiment of the present invention.

As shown in FIG. 2 and FIG. 3, an arrow direction indicates a direction in which the light enters. A display device of the present invention includes a display panel 101, a light shielding member 102, and an electronic element 103. The display panel 101 comprises a first display region 201 and a second display region 202 which is disposed corresponding to the electronic element 103, and a light transmittance of the second display region 202 is greater than a light transmittance of the first display region 201, wherein when the electronic element 103 is in operation, the light shielding member 102 is opened to open a light-transmitting channel between the electronic element 103 and the second display region 201, and when the electronic element 103 is not in operation, the light shielding member 102 is closed to close the light-transmitting channel.

In the present embodiment, as shown in FIGS. 2-3, a display device includes a display panel 101, a light shielding member 102, and an electronic element 103. The display panel 101 comprises a first display region 201 and a second display region 202 disposed corresponding to the electronic element 103, and pixels 10 disposed in the first display region 201 and the second display region 202. The pixels 10 comprise sub-pixels 30, such as A, B, and C, and a light transmittance of the second display region 202 is greater than a light transmittance of the first display region 201, wherein when the electronic element 103 is in operation, the light shielding member 102 is opened to open a light-transmitting channel 105 between the electronic element 103 and the second display region 202, and when the electronic element 103 is not in operation, the light shielding member 102 is closed to close the light-transmitting channel 105.

When the electronic element needs to be used, the light shielding member is opened, and when the electronic element is not needed, the light shielding member is used to shield and hide the electronic element. Consequently, a screen ratio is increased, and a full screen design is realized, thus eliminating a need to drill a hole in the display device and place the electronic element in the drilled hole.

Figure 4:
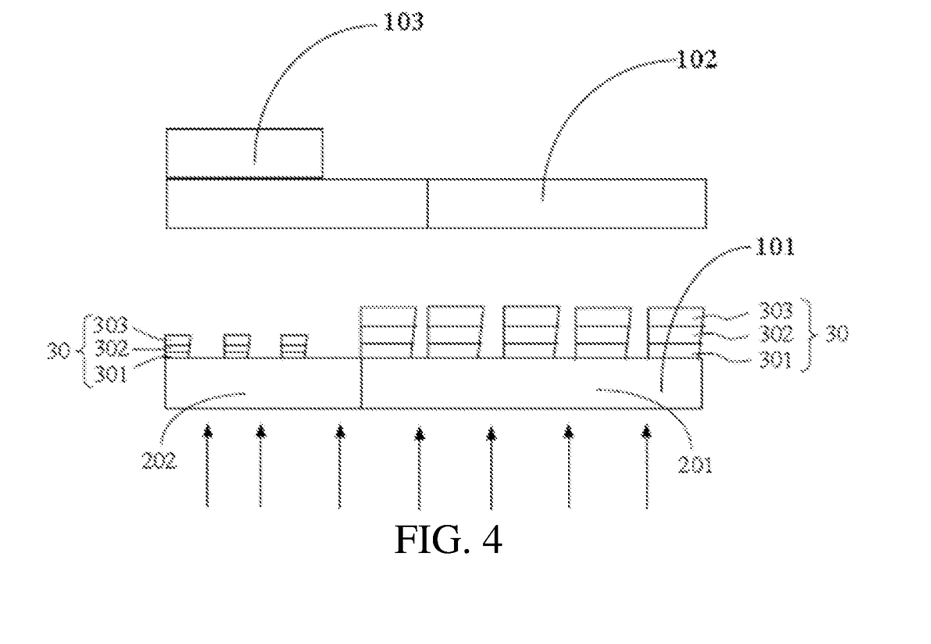
FIG. 4 is a second cross-sectional view illustrating the display device according to one embodiment of the present invention.

Referring to FIG. 4, according to one embodiment of the present invention, the light shielding member 102 is disposed on the electronic element 103.

As shown in FIG. 4, according to one embodiment, the light shielding member 102 is disposed on the electronic element 103 in a shutter-like manner, and the light shielding member 102 causes light exposure in the shutter-like manner, so that the electronic element 103 can function normally. When the electronic element 103 is not in operation, the light shielding member 102 is closed to hide the electronic element 103.

As shown in FIG. 4, according to one embodiment of the present invention, the electronic element is a camera. An exposure time of the light shielding member 102 is set to 1/60 second, the exposure time is short for shooting fast moving objects, and the 1/60 second can prevent a blurred picture from being taken due to hand shake.

As shown in FIG. 4, according to one embodiment of the present invention, the electronic element 103 is a camera, and the light shielding member 102 is disposed on a shutter. The shutter is disposed on the camera, and a reasonable exposure time is set. The light shielding member 102 is disposed on the shutter, and the light shielding member 102 is opened and closed with the shutter. Since the light shielding member 102 is opaque, the shutter may be made of a light transmissive material or an opaque material. The shutter functions to drive the light shielding member 102 to open and close.

According to one embodiment, the present invention further comprises a control assembly and a sensor for controlling a length of the exposure time, for controlling the exposure time of the shutter to be longer when shooting a high-speed moving object, and for controlling the exposure time of the shutter to be shorter when shooting a slow moving object or a stationary object.

According to one embodiment of the present invention, the light shielding member 102 and the electronic element 103 are made of two different materials. The light shielding member 102 is made of an opaque material, and the electronic element 103 is made of a light transmissive material.

According to one embodiment of the present invention, the light shielding member 102 and the electronic element 103 are made of two different materials. The light shielding member 102 is made of an opaque material, and the electronic element 103 is made of an opaque material.

Figure 5:
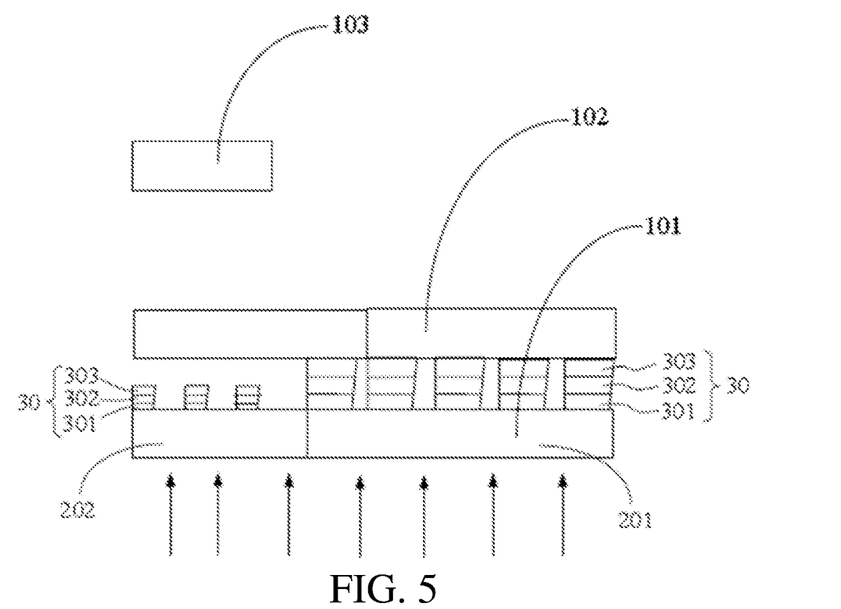
FIG. 5 is a fourth cross-sectional view illustrating the display device according to one embodiment of the present invention.

Referring to FIG. 5, according to one embodiment, the light shielding member 102 is disposed on the display panel 101.

According to one embodiment, the light shielding member 102 is disposed on the display panel and is made of electrochromic glass. When the electronic element 103 is in operation, the electrochromic glass is in a light transmissive state upon a voltage applied, and the light shielding member 102 allows light to pass therethrough. When the electronic element 103 is not in operation, the electrochromic glass has a different voltage, and the light shielding member 102 is opaque.

As shown in FIG. 5, according to one embodiment of the present invention, the light shielding member 102 is disposed at one side of the display panel 101 in a light emitting direction thereof.

Figure 6:
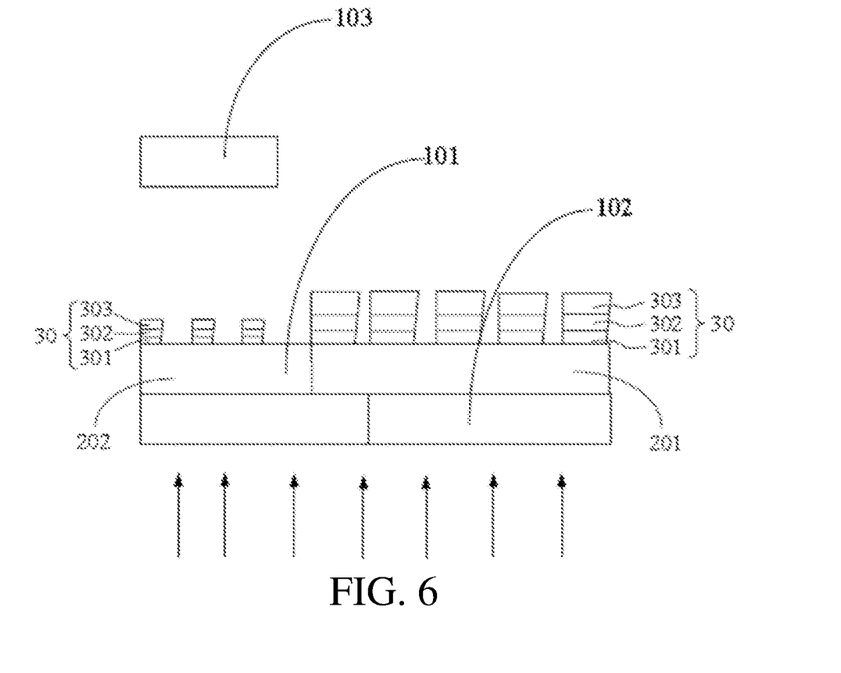
FIG. 6 is a fifth cross-sectional view illustrating the display device according to one embodiment of the present invention.

As shown in FIG. 6, according to one embodiment of the present invention, the light shielding member 102 is disposed on one side of the display panel 101 in a light incident direction thereof.

According to one embodiment of the present invention, the light shielding member 102 is disposed in a direction in which the display panel 101 faces the electronic element 103.

According to one embodiment of the present invention, the display panel 101 comprises a color changing layer, and the color changing layer is transparent in an operation time.

According to one embodiment of the present invention, the light shielding member 102 and the display panel 101 are made of two different materials.

According to one embodiment of the present invention, the light shielding member 102 and the display panel 101 are made of a same material.

According to one embodiment of the present invention, the light shielding member 102 and the display panel 101 are integrally formed in one piece.

According to one embodiment of the present invention, the light shielding member 102 is a separately formed member, and the light shielding member 102 comprises a motor and is adhered to the display panel 101 by an adhesive.

According to one embodiment of the present invention, the light shielding member 102 is a separately formed member, and the light shielding member 102 comprises a motor and is adhered to the electronic element 103 by an adhesive.

According to one embodiment of the present invention, a pixel aperture ratio of the second display region 202 is less than a pixel aperture ratio of the first display region 201, and a light transmissive region is formed between pixels.

According to one embodiment of the present invention, a pixel aperture ratio of the second display region 202 is less than a pixel aperture ratio of the first display region 201, and a light transmissive region is formed between pixels. A pixel width in the second display region 202 is shortened, so the pixel aperture ratio of the second display region 202 is increased.

According to one embodiment of the present invention, a pixel aperture ratio of the second display region 202 is less than a pixel aperture ratio of the first display region 201, and a light transmissive region is formed between pixels. A pixel length in the second display region 202 is shortened, so the pixel aperture ratio of the second display region 202 is increased.

According to one embodiment of the present invention, a pixel aperture ratio of the second display region 202 is less than a pixel aperture ratio of the first display region 201, and a light transmissive region is formed between pixels. In respect of an opaque portion of the pixels, leads and electrodes in the pixels provide a smaller light shielding area in a light emitting direction, so a pixel aperture ratio of the second display region 202 is increased.

According to one embodiment of the present invention, a pixel aperture ratio of the second display region 202 is less than a pixel aperture ratio of the first display region 201, and a light transmissive region is formed between pixels. In respect of an opaque portion of the pixels, leads and electrodes in the pixels are made of a light transmissive material, so a pixel aperture ratio of the second display region 202 is increased.

In one embodiment, the light shielding member 102 utilizes a polymer dispersed liquid crystal (PDLC) film and is disposed under the pixels of the display panel 101. By using the PDLC film as a light switch, when an external voltage is not applied, a regular electric field cannot be formed in the film, optical axes of the liquid crystal particles are randomly oriented in a disordered state. An effective refractive index of the liquid crystal particles does not match a refractive index of polymer, so incident light is strongly scattered, and the film is opaque or translucent. When an external voltage is applied, the optical axes of the liquid crystal particles are arranged perpendicular to a surface of the film, that is, arranged in a direction the same as a direction of the electric field. A normal refractive index of the liquid crystal particles substantially matches the refractive index of the polymer, so there is no obvious interface between them, and a substantially uniform medium is formed. As a result, scattering of the incident light is avoided, and the film is transparent. Therefore, driven by an externally applied electric field, the polymer dispersed liquid crystal (PDLC) film functions as a light switch.

According to one embodiment of the present invention, the electronic element 103 is a sensor such as a fingerprint sensor, an ambient light sensor, and a temperature sensor which are placed in a similar manner under a screen and do not affect a display effect. In the case of a fingerprint sensor under the screen, a color absorbing agent can be added to the polymer dispersed liquid crystal (PDLC) to allow only a detection light to pass through, thereby reducing interference of other colored lights on signals.

In one embodiment, the electronic element 103 is a light source array, and the light source array (such as an LED array) can be placed under the screen to control opening and closing of the light shielding layer automatically. The light source array can be placed in different positions with respect to the screen and can be used in an infrared remote control to control appliances, projectors and other devices. It can also be used to generate structured light for three-dimensional (3D) human body recognition. Since there are many positions that a light source can be placed, recognition with higher precision can be achieved.

In one embodiment, the electronic element 103 is a speaker. By placing and hiding the speaker under the screen, a plurality of speakers can be placed to realize stereo sound, and one or more speakers can be placed in different positions under the screen for a better stereo sound experience.

In one embodiment, the electronic element 103 is a microphone, and the microphone can be placed under the screen to realize a full screen.

In one embodiment, leads in the second display region 202 are made of a light transmissive material.

In one embodiment, the pixels in the second display region 202 are made of a light transmissive material to achieve a high aperture ratio so that more light can enter the camera or other electronic element 103.

In one embodiment, the pixels of an area in which components are located are miniaturized while the pixels of other areas remain unchanged. By this new manufacturing step, the pixels are miniaturized, and a pixel gap between the adjacent pixels is increased to 31 μm, which greatly increases a light-passing-through area. This design does not limit pixel arrangements, and actively adjusts pixel sizes of a single area or multiple areas by the manufacturing step modified according to requirements.

In one embodiment, under a same driving condition, brightness of the miniaturized pixels is lower than brightness of the normal pixels. By optimizing a driving algorithm of the second display region 202, a driving voltage in an area of the miniaturized pixels is increased, and the brightness of the area of the miniaturized pixels is increased to match the brightness of the normal pixels (a normal display area), thereby ensuring good display performance of a full screen.

In one embodiment, under a same driving condition, brightness of the miniaturized pixels is lower than brightness of the normal pixels. By optimizing a driving algorithm of the second display region 202, a driving current in an area of the miniaturized pixels is increased, and the brightness of the area of the miniaturized pixels is increased to match the brightness of the normal pixels (a normal display area), thereby ensuring good display performance of a full screen.

According to one embodiment of the present invention, the display device is an organic light emitting diode (OLED) display device.

According to one embodiment of the present invention, in the OLED display device, the light shielding member 102 is disposed on the electronic element 103.

According to one embodiment of the present invention, in the OLED display device, the light shielding member 102 is disposed on the electronic element 103 in a shutter-like manner, and the light shielding member 102 causes light exposure in the shutter-like manner, so that the electronic element 103 can function normally. When the electronic element 103 is not in operation, the light shielding member 102 is closed to hide the electronic element 103.

According to one embodiment of the present invention, in the OLED display device, the electronic element 103 is a camera. An exposure time of the light shielding member 102 is set to 1/60 second, the exposure time is short for shooting fast moving objects, and the 1/60 second can prevent a blurred picture from being taken due to hand shake.

According to one embodiment of the present invention, in the OLED display device, the electronic element 103 is a camera, and the light shielding member 102 is disposed on a shutter. The shutter is disposed on the camera, and a reasonable exposure time is set, the light shielding member 102 is disposed on the shutter, and the light shielding member 102 is opened and closed with the shutter. Since the light shielding member 102 is opaque, the shutter may be made of a light transmissive material or an opaque material. The shutter functions to drive the light shielding member 102 to open and close.

According to one embodiment, in the OLED display device, the present invention further comprises a control assembly and a sensor for controlling a length of the exposure time, wherein the exposure time of the shutter is controlled to be longer when shooting a high-speed moving object, and the exposure time of the shutter is controlled to be shorter when shooting a slow moving object or a stationary object.

According to one embodiment of the present invention, in the OLED display device, the light shielding member 102 and the electronic element 103 are made of two different materials. The light shielding member 102 is made of an opaque material, and the electronic element 103 is made of a light transmissive material.

According to one embodiment of the present invention, in the OLED display device, the light shielding member 102 and the electronic element 103 are made of two different materials. The light shielding member 102 is made of an opaque material, and the electronic element 103 is made of an opaque material.

According to one embodiment of the present invention, in the OLED display device, the light shielding member 102 is disposed on the display panel 101.

According to one embodiment of the present invention, in the OLED display device, the light shielding member 102 is disposed on the display panel 101 and is made of electrochromic glass. When the electronic element 103 is in operation, the electrochromic glass is in a light transmissive state upon a voltage applied, and the light shielding member 102 allows light to pass therethrough. When the electronic element 103 is not in operation, the electrochromic glass has a different voltage, and the light shielding member 102 is opaque.

According to one embodiment of the present invention, in the OLED display device, the light shielding member 102 is disposed at one side of the display panel 101 in a light emitting direction thereof.

According to one embodiment of the present invention, in the OLED display device, the light shielding member 102 is disposed on one side of the display panel 101 in a light incident direction thereof.

According to one embodiment of the present invention, in the OLED display device, the light shielding member 102 is disposed in a direction in which the display panel 101 faces the electronic element 103.

According to one embodiment of the present invention, in the OLED display device, the display panel 101 comprises a color changing layer, and the color changing layer is transparent in an operation time.

According to one embodiment of the present invention, in the OLED display device, the light shielding member 102 and the display panel 101 are made of two different materials.

According to one embodiment of the present invention, in the OLED display device, the light shielding member 102 and the display panel 101 are made of a same material.

According to one embodiment of the present invention, in the OLED display device, the light shielding member 102 and the display panel 101 are integrally formed in one piece.

According to one embodiment of the present invention, in the OLED display device, the light shielding member 102 is a separately formed member, and the light shielding member 102 comprises a motor and is adhered to the display panel 101 by an adhesive.

According to one embodiment of the present invention, in the OLED display device, a pixel aperture ratio of the second display region 202 is greater than a pixel aperture ratio of the first display region 201, and a light transmissive region is formed between pixels.

According to one embodiment of the present invention, in the OLED display panel, a pixel aperture ratio of the second display region 202 is greater than a pixel aperture ratio of the first display region 201, and a light transmissive region is formed between pixels. A pixel width in the second display region 202 is shortened, so the pixel aperture ratio of the second display region 202 is increased.

According to one embodiment of the present invention, in the OLED display device, a pixel aperture ratio of the second display region 202 is greater than a pixel aperture ratio of the first display region 201, and a light transmissive region is formed between pixels. A pixel length in the second display region 202 is shortened, so the pixel aperture ratio of the second display region 202 is increased.

According to one embodiment of the present invention, in the OLED display device, a pixel aperture ratio of the second display region 202 is greater than a pixel aperture ratio of the first display region 201, and a light transmissive region is formed between pixels. In respect of an opaque portion of the pixels, leads and electrodes in the pixels provide a smaller light shielding area in a light emitting direction, so a pixel aperture ratio of the second display region 202 is increased.

According to one embodiment of the present invention, in the OLED display device, a pixel aperture ratio of the second display region 202 is greater than a pixel aperture ratio of the first display region 201, and a light transmissive region is formed between pixels. In respect of an opaque portion of the pixels, leads and electrodes in the pixels are made of a light transmissive material, so a pixel aperture ratio of the second display region 202 is increased.

In the OLED display device according to one embodiment of the present invention, the light shielding member 102 utilizes a polymer dispersed liquid crystal (PDLC) film and is disposed under the pixels of the display panel 101. By using the PDLC film as a light switch, when no external voltage is applied, a regular electric field cannot be formed in the film, optical axes of the liquid crystal particles are randomly oriented in a disordered state. An effective refractive index of the liquid crystal particles does not match a refractive index of polymer, so incident light is strongly scattered, and the film is opaque or translucent. When an external voltage is applied, the optical axes of the liquid crystal particles are arranged perpendicular to a surface of the film, that is, arranged in a direction the same as a direction of the electric field. A normal refractive index of the liquid crystal particles substantially matches the refractive index of the polymer, so there is no obvious interface between them, and a substantially uniform medium is formed. As a result, scattering of the incident light is avoided, and the film is transparent. Therefore, driven by an externally applied electric field, the polymer dispersed liquid crystal (PDLC) film functions as a light switch.

According to one embodiment of the present invention, in the OLED display device, the electronic element 103 is a sensor such as a fingerprint sensor, an ambient light sensor, a temperature sensor which are placed in a similar manner under a screen and do not affect a display effect. In the case of a fingerprint sensor under the screen, a color absorbing agent can be added to the polymer dispersed liquid crystal (PDLC) to allow only a detection light to pass through, thereby reducing interference of other colored lights on signals.

According to one embodiment of the present invention, in the OLED display device, the electronic element 103 is a light source array, and the light source array (e.g., an LED array) can be placed under the screen to control opening and closing of the light shielding layer automatically. The light source array can be placed in different positions with respect to the screen and can be used in an infrared remote control to control appliances, projectors and other devices. It can also be used to generate structured light for three-dimensional (3D) human body recognition. Since there are many positions where a light source can be placed, recognition with higher precision can be achieved.

According to one embodiment of the present invention, in the OLED display device, the electronic element 103 is a speaker. By placing and hiding the speaker under the screen, a plurality of speakers can be placed to realize stereo sound, and one or more speakers can be placed in different positions under the screen for a better stereo sound experience.

According to one embodiment of the present invention, in the OLED display device, the electronic element 103 is a microphone, and the microphone can be placed under the screen to realize a full screen design.

According to one embodiment of the present invention, in the OLED display device, leads in the second display region 202 are made of a light transmissive material.

According to one embodiment of the present invention, shown in FIGS. 3-4, in the OLED display device, the pixels 10 in the second display region 202 are made of a light transmissive material to achieve a high aperture ratio, so that more light can enter the camera or other electronic element 103.

According to one embodiment of the present invention, in the OLED display device, each sub-pixel 30 of the pixels 10 in an area in which components are located are miniaturized while the sub-pixels 30 in other areas remain unchanged. By this new manufacturing step, each sub-pixel 30 of the pixels 10 are miniaturized, and a pixel gap between the adjacent sub-pixels 30 is increased to 31 μm, which greatly increases a light-passing-through area. This design does not limit arrangements for the sub-pixels 30, but actively adjusts sizes for the sub-pixels 30 in a single area or multiple areas by the manufacturing step modified according to requirements.

According to one embodiment of the present invention, in the OLED display device, under a same driving condition, brightness of the miniaturized sub-pixels 30 is lower than brightness of the normal sub-pixels 30. By optimizing a driving algorithm of the second display region 202, a driving voltage in an area of the miniaturized sub-pixels 30 is increased, and the brightness in the area of the miniaturized sub-pixels 30 is increased to match the brightness of the normal sub-pixels 30 (i.e., a normal display area), thereby ensuring good display performance of a full screen.

In the OLED display device according to one embodiment of the present invention, under a same driving condition, brightness of the miniaturized sub-pixels 30 is lower than brightness of the normal sub-pixels 30. By optimizing a driving algorithm of the second display region 202, a driving current in an area of the miniaturized sub-pixels 30 is increased, and the brightness of the area of the miniaturized sub-pixels 30 is increased to match the brightness of the normal sub-pixels 30 (i.e., a normal display area), thereby ensuring good display performance of a full screen.

According to one embodiment of the present invention, as shown in FIGS. 2-6, in the OLED display device, each sub-pixel 30 in the first display region 201 and the second display region 202 comprises an anode 301, a light emitting layer 302, and a cathode 303. The light emitting layer 302 is disposed between the anode 301 and the cathode 303, and the cathode 303 is disposed away form the display panel 101. An area of the light emitting layer 302 of each sub-pixel 30 in the second display region 202 is smaller than an area of the light emitting layer 302 of each sub-pixel 30 in the first display region 201.

According to one embodiment of the present invention, in the OLED display device, a width of an area of the light emitting layer 302 of each sub-pixel 30 in the second display region 202 is narrowed down and is narrower than a width of an area of the light emitting layer 302 of each sub-pixel 30 in the first display region 201.

According to one embodiment of the present invention, in the OLED display device, a length of an area of the light emitting layer 302 of the each sub-pixel 30 in the second display region 202 is shortened and is shorter than a length of an area of the light emitting layer 302 of each sub-pixel 30 in the first display region 201.

According to one embodiment of the present invention, in the OLED display device, an area of the cathode 303 of each sub-pixel 30 in the second display region 202 is smaller than an area of the cathode 303 of each sub-pixel 30 in the first display region 201.

According to one embodiment of the present invention, in the OLED display device, an area of the anode 301 of each sub-pixel 30 in the second display region 202 is smaller than an area of the anode of each sub-pixel 30 in the first display region 201.

According to one embodiment of the present invention, in the OLED display device, a width of an area of the anode 301 of each sub-pixel 30 in the second display region 202 is narrowed down and is narrower than a width of an area of the anode 301 of each sub-pixel 30 in the first display region 201.

According to one embodiment of the present invention, in the OLED display device, a length of an area of the anode 301 of each sub-pixel 30 in the second display region 202 is shortened and is shortened than a length of an area of the anode 301 of each sub-pixel 30 in the first display region 201.

According to one embodiment of the present invention, in the OLED display device, each sub-pixel 30 of the pixels 10 in an area in which components are located are miniaturized while the sub-pixels 30 in other areas remain unchanged. By this new manufacturing step, each sub-pixel 30 of the pixels 10 are miniaturized, and a pixel gap between the adjacent sub-pixels 30 is increased to 31 µm, which greatly increases a light-passing-through area. This design does not limit arrangements for the sub-pixels 30, but actively adjusts sizes for the sub-pixels 30 in a single area or multiple areas by the manufacturing step modified according to requirements.

According to one embodiment of the present invention, in the OLED display device, under a same driving condition, brightness of the miniaturized sub-pixels 30 is lower than brightness of the normal sub-pixels 30. By optimizing a driving algorithm of the second display region 202, a driving voltage in an area of the miniaturized sub-pixels 30 is increased, and the brightness in the area of the miniaturized sub-pixels 30 is increased to match the brightness of the normal sub-pixels 30 (i.e., a normal display area), thereby ensuring good display performance of a full screen.

In the OLED display device according to one embodiment of the present invention, under a same driving condition, brightness of the miniaturized sub-pixels 30 is lower than brightness of the normal sub-pixels 30. By optimizing a driving algorithm of the second display region 202, a driving current in an area of the miniaturized sub-pixels 30 is increased, and the brightness of the area of the miniaturized sub-pixels 30 is increased to match the brightness of the normal sub-pixels 30 (i.e., a normal display area), thereby ensuring good display performance of a full screen.

According to one embodiment of the present invention, as shown in FIGS. 2-6, in the OLED display device, each sub-pixel 30 in the first display region 201 and the second display region 202 comprises an anode 301, a light emitting layer 302, and a cathode 303. The light emitting layer 302 is disposed between the anode 301 and the cathode 303, and the cathode 303 is disposed away form the display panel 101. An area of the light emitting layer 302 of each sub-pixel 30 in the second display region 202 is smaller than an area of the light emitting layer 302 of each sub-pixel 30 in the first display region 201.

According to one embodiment of the present invention, in the OLED display device, a width of an area of the light emitting layer 302 of each sub-pixel 30 in the second display region 202 is narrowed down and is narrower than a width of an area of the light emitting layer 302 of each sub-pixel 30 in the first display region 201.

According to one embodiment of the present invention, in the OLED display device, a length of an area of the light emitting layer 302 of each sub-pixel 30 in the second display region 202 is shortened and is shorter than a length of an area of the light emitting layer 302 of each sub-pixel 30 in the first display region 201.

According to one embodiment of the present invention, in the OLED display device, an area of the cathode 303 of each sub-pixel 30 in the second display region 202 is smaller than an area of the cathode 303 of each sub-pixel 30 in the first display region 201.

According to one embodiment of the present invention, in the OLED display device, an area of the anode 301 of each sub-pixel 30 in the second display region 202 is smaller than an area of the anode of each sub-pixel 30 in the first display region 201.

According to one embodiment of the present invention, in the OLED display device, a width of an area of the anode 301 of each sub-pixel 30 in the second display region 202 is narrowed down and is narrower than a width of an area of the anode 301 of each sub-pixel 30 in the first display region 201.

According to one embodiment of the present invention, in the OLED display device, a length of an area of the anode 301 of a light emitting electrode of each sub-pixel 30 in the second display region 202 is shortened and is shortened than a length of an area of the anode 301 of each sub-pixel 30 in the first display region 201.

In summary, according to the above embodiments, the present invention provides a display device which includes a display panel 101, a light shielding member 102, and an electronic element 103. The display panel 101 comprises a first display region 201 and a second display region 202 disposed corresponding to the electronic element 103, and a light transmittance of the second display region 202 is greater than a light transmittance of the first display region 201, wherein when the electronic element 103 is in operation, the light shielding member 102 is opened to open a light-transmitting channel 105 between the electronic element 103 and the second display region 202, and when the electronic element 103 is not in operation, the light shielding member 102 is closed to close the light-transmitting channel 105. When the electronic element 103 needs to be used, the light shielding member 102 is opened. When the electronic element 103 is not needed, the light shielding member 102 shields the electronic element 103 to hide it. Therefore, a screen ratio is increased, a full screen design is realized, and the present invention eliminates a need to drill a hole in the display device and place the electronic element 103 in the hole.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A display device, comprising:
a display panel;
a light shielding member; and
an electronic element;
wherein the light shielding member is disposed on the electronic element or on the display panel;
wherein the display panel comprises a first display region, a second display region disposed corresponding to the electronic element, and pixels disposed in the first display region and the second display region, each pixel comprises sub-pixels, the electronic element is disposed within an area above the second display region, and a light transmittance of the second display region is greater than a light transmittance of the first display region, wherein when the electronic element is in operation, the light shielding member is opened to open a light-transmitting channel between the electronic element and the second display region, and when the electronic element is not in operation, the light shielding member is closed to close the light-transmitting channel.

2. The display device according to claim 1, wherein the electronic element is a camera, and the light shielding member is disposed on a shutter of the camera and disposed on the electronic element.

3. The display device according to claim 1, wherein the light shielding member is made of electrochromic glass and disposed on the display panel.

4. The display device according to claim 1, wherein the light shielding member is disposed on a light emitting side of the display panel and arranged on the display panel.

5. The display device according to claim 1, wherein the light shielding member is disposed on one side of the display panel facing the electronic element.

6. The display device according to claim 1, wherein the light shielding member is disposed on the display panel, and the light shielding member and the display panel are integrally formed in one piece.

7. The display device according to claim 1, wherein a pixel aperture ratio of the second display region is greater than a pixel aperture ratio of the first display region, and a light transmissive region is formed between pixels.

8. The display device according to claim 7, wherein a width of each sub-pixel in the second display region is shortened.

9. The display device according to claim 7, wherein a length of each sub-pixel in the second display region is shortened.

10. The display device according to claim 7, wherein sub-pixels in the second display region are made of a light transmissive material.

11. The display device according to claim 1, wherein each of the sub-pixels in the display panel comprises an anode, a light emitting layer, and a cathode, the light emitting layer is disposed between the anode and the cathode, and the cathode is disposed away form the display panel.

12. The display device according to claim 11, wherein a width of an area of the light emitting layer of each sub-pixel in the second display region is less than a width of an area of the light emitting layer of each sub-pixel in the first display region.

13. The display device according to claim 11, wherein a length of an area of the light emitting layer of each sub-pixel in the second display region is less than a length of an area of the light emitting layer of each sub-pixel in the first display region.

14. The display device according to claim 11, wherein an area of the cathode of each sub-pixel in the second display region is smaller than an area of the cathode of each sub-pixel in the first display region, and an area of the anode of each sub-pixel in the second display region is smaller than an area of the anode of each sub-pixel in the first display region.

15. The display device according to claim 11, wherein a width of an area of the anode of each sub-pixel in the second display region is less than a width of an area of the anode of each sub-pixel in the first display region.

16. The display device according to claim 11, wherein a length of an area of the anode of each sub-pixel in the second display region is less than a length of an area of the anode of each sub-pixel in the first display region.

* * * * *